(12) United States Patent
Pennisi et al.

(10) Patent No.: US 11,079,442 B2
(45) Date of Patent: Aug. 3, 2021

(54) METHOD OF OPERATING BATTERY MANAGEMENT SYSTEMS, CORRESPONDING DEVICE AND VEHICLE

(71) Applicant: STMicroelectronics S.r.l., Agrate Brianza (IT)

(72) Inventors: Orazio Pennisi, Pieve Emanuele (IT); Valerio Bendotti, Vilminore di Scalve (IT); Vanni Poletto, Milan (IT); Vittorio D'Angelo, Salerno (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 199 days.

(21) Appl. No.: 16/420,992

(22) Filed: May 23, 2019

(65) Prior Publication Data

US 2019/0372178 A1 Dec. 5, 2019

(30) Foreign Application Priority Data

May 29, 2018 (IT) .......................... 102018000005828

(51) Int. Cl.
| | |
|---|---|
| *H01M 10/48* | (2006.01) |
| *B60L 58/22* | (2019.01) |
| *G01R 31/396* | (2019.01) |
| *H02J 7/00* | (2006.01) |
| *H01M 10/46* | (2006.01) |
| *G01R 31/50* | (2020.01) |
| *G01R 31/52* | (2020.01) |
| *G01R 31/54* | (2020.01) |

(52) U.S. Cl.
CPC ............ *G01R 31/396* (2019.01); *B60L 58/22* (2019.02); *G01R 31/50* (2020.01); *G01R 31/52* (2020.01); *G01R 31/54* (2020.01); *H01M 10/46* (2013.01); *H01M 10/482* (2013.01); *H02J 7/0021* (2013.01)

(58) Field of Classification Search
CPC ..... H01M 10/482; H01M 10/46; B60L 58/22; H02J 7/0021; G01R 31/396
USPC ........................................................ 320/134
See application file for complete search history.

(56) References Cited

U.S. PATENT DOCUMENTS

| | | | | |
|---|---|---|---|---|
| 7,880,432 | B2* | 2/2011 | Yun et al. ............. | B60L 3/0038 320/116 |
| 9,537,328 | B2* | 1/2017 | Kim ..................... | H02J 7/0014 |
| 10,330,736 | B2* | 6/2019 | Sekiguchi et al. ... | G01R 31/385 |
| 10,862,317 | B2* | 12/2020 | Loncarevic .......... | H02J 7/0016 |
| 2013/0026994 | A1 | 1/2013 | Morikawa | |
| 2014/0253135 | A1 | 9/2014 | Eguchi et al. | |

(Continued)

*Primary Examiner* — Sun J Lin
(74) *Attorney, Agent, or Firm* — Slater Matsil, LLP

(57) ABSTRACT

A method of operating a control device includes performing an open load test or a current leakage test. The open load test includes activating a first current and then a second current and sensing with the first current and the second current activated, respectively, a first voltage drop and a second voltage drop between charge distribution pins and charge sensing pins of the control device. Respective differences are calculated between the first voltage drop and the second voltage drop sensed with the first current and the second current activated, respectively. These differences are compared with respective thresholds and an open circuit condition is declared as a result of the differences calculated reaching these thresholds.

23 Claims, 7 Drawing Sheets

(56) References Cited

U.S. PATENT DOCUMENTS

2014/0285936 A1\* 9/2014 Garbacik et al. ..... B60L 3/0046
                                                    361/88
2017/0184678 A1   6/2017 Sekiguchi et al.

\* cited by examiner

METHOD OF OPERATING BATTERY MANAGEMENT SYSTEMS, CORRESPONDING DEVICE AND VEHICLE

CROSS-REFERENCE TO RELATED APPLICATIONS

This application claims priority to Italian Patent Application No. 102018000005828, filed on May 29, 2018, which application is hereby incorporated herein by reference.

TECHNICAL FIELD

The description relates to battery management systems, such as systems that can be applied in the automotive field.

BACKGROUND

The evolving technology of electric vehicles (EVs) and hybrid electric vehicles (HEVs) makes improved performance of battery management systems (BMS) a desirable feature in order to facilitate safe, reliable and cost-efficient battery operation.

A task of a battery management system (BMS) involves open load detection and/or leakage current evaluation.

Certain solutions have been proposed which provide (only) an open load diagnosis by performing two measures with pull-up and pull-down currents applied to resistors associated to individual battery cells.

External resistors in low-pass filters with a voltage threshold used to discriminate between open and non-open current paths may be exemplary of such arrangements that rely on two or more measures in different time steps.

This may represent a drawback, for instance due to possible signal changes between two measurements.

Additionally, it is noted that, for instance in automotive applications, the electric motor of the vehicle and its associated driver circuitry may be the source of noise in the form of currents injected into the battery cells or as a voltage drops across these cells. These may represent a source of electromagnetic interference over a wide range of frequencies with possible undesired effects on functional measurements and diagnosis.

SUMMARY

One or more embodiments can be applied in the automotive field, for instance to electric vehicles and/or hybrid electric vehicles.

One or more embodiments can contribute in providing improved solutions overcoming drawbacks discussed in the foregoing.

One or more embodiments may relate to a corresponding device, for instance a battery management system or BMS.

One or more embodiments may relate to a vehicle (for instance, a motor vehicle such as an EV or a HEV) equipped with such a device.

One or more embodiments may facilitate failure detection of terminal cells in battery management systems with the capability of detecting in a reliable manner open wire and/or leakage conditions.

One or more embodiments may facilitate diagnosis by improving immunity to system noise while also increasing open wire and leakage detection measurement accuracy.

One or more embodiments facilitate detecting both open wire and leakage.

In one or more embodiments such acts of detection may take place essentially at the same time.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
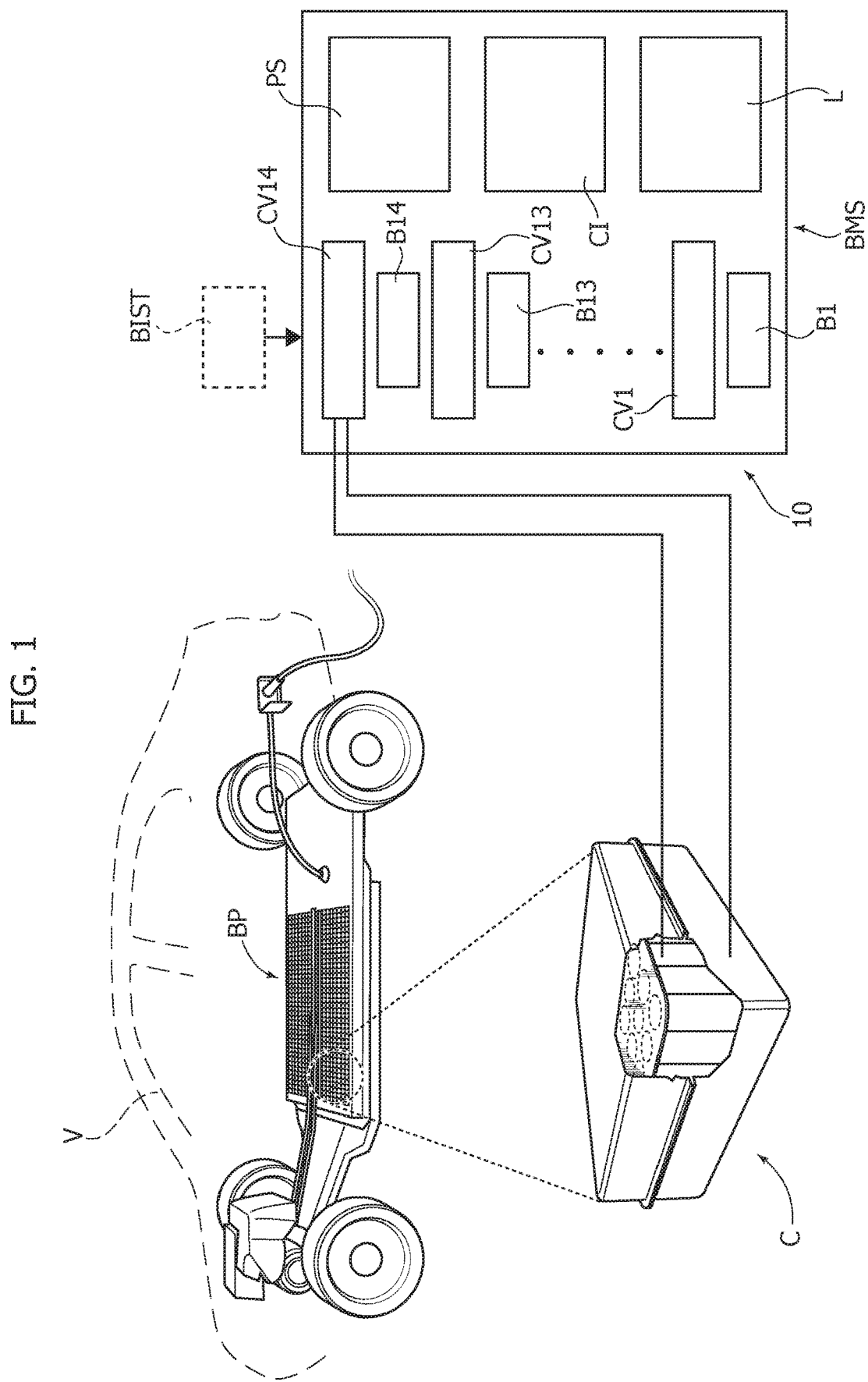
FIG. 1 is a block diagram exemplary of a possible context of use of embodiments.

FIG. 1 is exemplary of a possible arrangement of a battery pack BP equipping a vehicle V such as an electric vehicle (EV) or a hybrid electric vehicle (HEV) with an associated battery management system BMS. A lithium battery pack may be exemplary of such a battery pack.

Reference to such a possible area of application and/or to such battery technology is not however to be understood in a limiting sense of embodiments.

In one or more embodiments as exemplified herein, the battery management system BMS may comprise a device 10 (for instance an integrated circuit IC) providing various features desirable in performing battery management, for instance with a (single) device 10 configured to monitor from 4 up to 14 cells C.

In one or more embodiments, the device 10 can be configured to co-operate with a power supply PS (which may be derived from the very battery pack BP monitored by the device 10), a communication interface C and a logic L.

The device 10 may also generate stable internal references, for instance by means of a voltage regulator and bootstrap circuit. Also, it may comprise bandgaps monitored by internal circuitry to facilitate measurement accuracy.

A task of the device 10 may comprise monitoring cell and battery pack status through stack voltage measurement and cell voltage measurement. The related measurement and diagnostic tasks can be executed either on demand or periodically, for instance with a programmable cycle interval.

Measurement data may be made available for an external controller to perform a charge balancing and to compute data indicative of the State of Health (SOH) and State of A Charge (SOC) of the cells/battery pack.

In a normal operating mode, the device 10 may perform measurement conversions, diagnostics and communication tasks. Optionally, the device 10 can be set to a cyclical wake up state, thus reducing current consumption (for instance as absorbed from the battery pack BP). While in the cyclic wake up state, the main functions of the device 10 are activated periodically.

The device available with the trade designation L9963 with companies of the STMicroelectronics Group may be exemplary of a conventional arrangement for such a device 10.

In one or more embodiments a device 10 as exemplified herein may comprise a set of converters CV1, ..., CV14 as well as balance circuit blocks B1, ..., B14 associated to respective cells C in the battery pack BP.

For instance, the circuit blocks B1, ..., B14 can provide a (passive) cell balancing via internal discharge paths. This action aims at balancing cells in order to facilitate an equalized charge distribution over all the cells. This is found to improve performance of the battery pack BP.

A device 10 as exemplified herein can be configured to perform automatic "validation" of a failure event involving the individual cells C, or the whole battery pack BP.

The related tests can be performed automatically, for instance in the case of a failure detected involving either a cell C or the battery pack BP. This facilitates providing reliable information (for instance via the communication interface, CI) to an external microcontroller supervising operation of the battery management system BMS.

In one or more embodiments the logic block L exemplified in FIG. 1 may be comprised in such a microcontroller.

A device 10 as exemplified herein may comprise (for instance at the converters CV1, ..., CV14) Built-In Self Test (BIST) circuitry configured to facilitate a correct operation of internal elements such as analog comparators and analog-to-digital converters (ADCs).

A circuit 10 as exemplified herein may comprise a BIST circuit as disclosed in a co-pending Italian patent application filed on even date in the same applicant.

The representation provided in FIG. 1 is a general functional description of the device 10.

More in detail, a device 10 as exemplified herein (see, for instance, FIG. 2) may comprise charge-sensing pins Cn, namely C1, ..., C14, in the case exemplified herein. The charge-sensing pins Cn are coupled to the cells C in the battery pack BP, with, for instance, an n-th cell, Celln, arranged between the pins Cn and Cn−1.

As exemplified herein (see again, for instance, FIG. 2) a first cell Cell1 is shown arranged between the pins C0 and C1 and so on up to the cell Cell14 arranged between the pins C13 and C14.

For the sake of simplicity, the various cells can be considered as identical. Each of them may thus have a resistor $R_{LPF}$, arranged coupling the pins C0, ..., C14, to respective ends of the cells Cell1, ..., Cell14 and a capacitor CAP between adjacent pins.

The resistors $R_{LPF}$ and the capacitors CAP provide respective low-pass RC filters, which facilitate filtering out unwanted signals at the battery terminals.

In one or more embodiments the pins C0, ..., C14 of the device 10 can be regarded as a high-impedance nodes so that no appreciable voltage drop may be assumed to occur across the resistors $R_{LPF}$.

Consequently, a (differential) voltage $V_{diff}$ substantially corresponding to the voltage across the n-th cell Celln may be assumed to be available for "reading" between adjacent pins Cn−1 and Cn.

In one or more embodiments, further pins designated Sn (n=1, ..., 14) as well as pins Bn_n−1 (with N=2, ..., 14 in the case exemplified herein) may be used for balance purposes, namely for discharging cells which are detected to be "too charged" in order to equalize the distribution of charge over all the cells.

The amount of the (balance) discharge current may be set by resistors $R_{DIS}$ coupling the "even numbered" S pins, namely S2, ..., S14 to the "upper" end (namely the end or node towards the overall voltage Vb of the battery pack), and the "odd numbered" S pins, namely S1, ..., S13 to the "lower" end or node (opposite the battery pack voltage VB, that is towards ground GND) of the corresponding cell.

The pins Bn_n−1 are (directly) coupled between the resistors $R_{LPF}$ and the corresponding ends of the cells Cell1, ..., Cell14 where no discharge resistor $R_{DIS}$ are provided.

Figure 2:
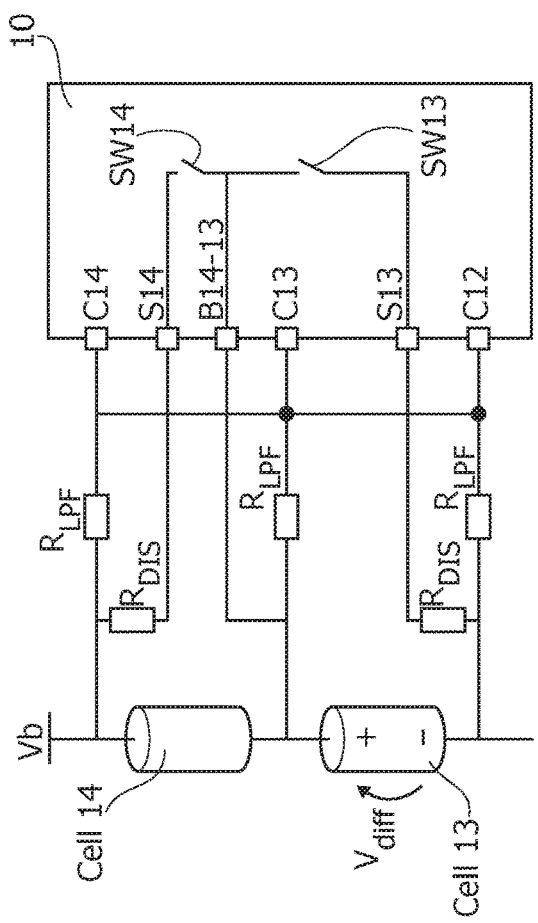
FIG. 2 is a block diagram exemplary of a device to which embodiments may apply.
Figure 3:
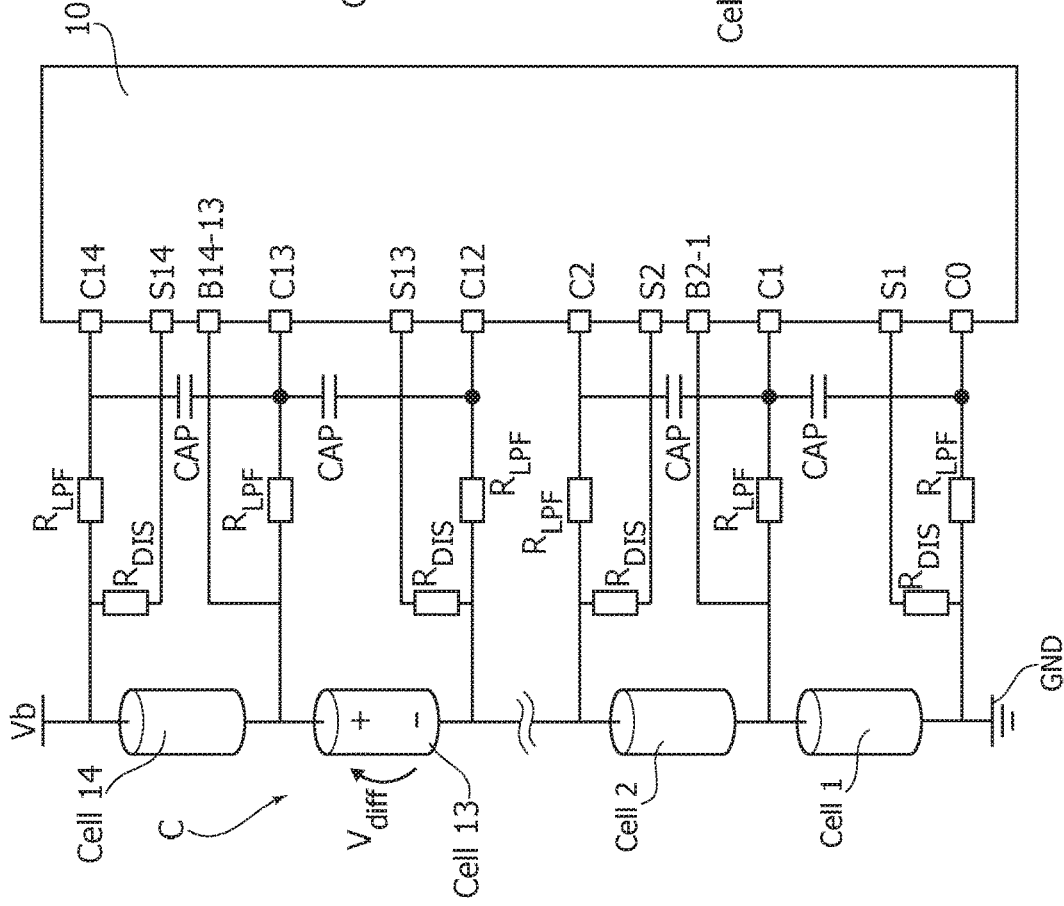
FIG. 3 is a circuit diagram exemplary of a portion of the device of FIG. 2, FIGS. 4 and 5 are diagrams exemplary of open load detection according to one or more embodiments.

FIG. 3 details by way of simplicity the arrangement discussed in the foregoing with reference to the two "uppermost" cells in the battery pack BP exemplified herein, namely Cell14 and a Cell13 by showing the corresponding coupling of the pins C12, C13, C14, S13, S14, and B14-13 of the device 10. The associated capacitors CAP shown in FIG. 2 are not reproduced in FIG. 3 for simplicity).

The device 10 as exemplified herein may thus be considered to comprise a plurality of charge-sensing pins C0 to C14 which can be regarded as arranged in an ordered (numbered) sequence of pins C0 to C14, for instance starting from ground GND to the "upper" voltage Vb node or bar of the battery pack BP, with these charge-sensing pins comprising even-numbered pins (C0, C2, C4, ..., C14) interleaved with odd-numbered pins (C1, C3, ..., C13).

Also, the pins C0 to C14 can be seen as comprising a plurality of pairs of charge-sensing pins, namely C0, C1; C1, C2; ... ; C12, C13; C13, C14 arranged in an ordered sequence of:

those pairs of charge-sensing pins that are in odd-numbered positions (1, 3, 5, 7, 9, 11, 13) in the ordered sequence (from ground GND to Vb) of charge-sensing pins C1 to C14 exemplified herein, namely:

C0, C1;
C2, C3;
C4, C5;
C6, C7;
C8, C9;
C10, C11;
C12, C13;

and those pairs of charge-sensing pins that are in even-numbered positions (2, 4, 6, 8, 10, 12, 14) in the ordered sequence (from ground GND to Vb) of charge-sensing pins C1 to C14 exemplified herein, namely:

C1, C2;
C3, C4;

C5, C6;
C7, C8;
C9, C10;
C11, C12;
C13, C14.

The charge sensing pins in the pairs of charge-sensing pins in the plurality of pairs (C0, C1; C1, C2; . . . ; C12, C13; C13, C14) of charge-sensing pins are coupled via a coupling resistor ($R_{LPF}$) to a respective cell (Cell1, Cell2, . . . , Cell13, Cell14) in the battery pack BP to sense the voltage across the respective cell.

Also, each odd-numbered (C0, C1; . . . ; C12, C13) resp. even-numbered (C1, C2; . . . ; C13, C14) pair of charge-sensing pins shares a common charge sensing pin (C1, . . . , C13) with the subsequent even-numbered pair (C1, C2; . . . ; C13, C14) resp. previous odd-numbered pair (C0, C1; . . . ; C12, C13) of charge-sensing pins in the ordered sequence of odd- and even-numbered pairs of charge-sensing pins.

For instance, as seen in FIG. 3:

the odd-numbered pair C12, C13 of charge-sensing pins shares a common charge sensing pin, namely C13, with the subsequent even-numbered pair C13, C14 in the ordered sequence of charge sensing pins, and, likewise the even-numbered pair C13, C14 of charge-sensing pins shares a common charge sensing pin, again C13, with the previous odd-numbered pair C12, C13 in the ordered sequence of charge sensing pins.

Also, the charge distribution pins as exemplified herein can be regarded as comprising first charge distribution pins S1, . . . , S14 and second charge distribution pins B2-1, . . . , B14-13.

By again referring to FIG. 3, one may further note that, in a device 10 as exemplified herein, each odd-numbered pair of charge-sensing pins (C12, C13, in the case of FIG. 3) and the subsequent even-numbered pair (C13, C14, in the case of FIG. 3) of charge-sensing pins in the ordered sequence of odd- and even-numbered pairs of charge-sensing pins comprise:

a) an odd-numbered first charge distribution pin (S13, in the case of FIG. 3) coupled via a discharge resistor $R_{DIS}$ to the charge sensing pin (C12, in the case of FIG. 3) of the odd-numbered pair (C12, C13, in the case of FIG. 3) of charge-sensing pins other than the common charge sensing pin (C13, in the case of FIG. 3), b) an even-numbered first charge distribution pin (S14, in the case of FIG. 3) coupled via a discharge resistor $R_{DIS}$ to the charge sensing pin (C14, in the case of FIG. 3) of the even-numbered pair (C13, C14, in the case of FIG. 3) of charge-sensing pins other than the common charge sensing pin (C13, in the case of FIG. 3), c) a second charge distribution pin (B14-13, in the case of FIG. 3) coupled via a charge sensing resistor $R_{LPF}$ to the common charge sensing pin (C13, in the case of FIG. 3), the second charge distribution pin (here B14-13) configured to be selectively coupled via switches SW13, SW14 to the odd-numbered first charge distribution pin (S13, in the case of FIG. 3) and the even-numbered first charge distribution pin (S14, in the case of FIG. 3) to exchange electrical charge therewith in order to perform a charge balance function.

As represented for the sake of simplicity (only) in FIG. 3, when the balance function is activated on a specific cell, an associated switch is activated to discharge the cell with a current whose intensity I is given by the ratio $V_{Diff}/R_{DIS}$. TWO such switches (SW13 or SW14 in FIG. 3, which may be implemented as electronic switches such as a MOSFET transistor) are shown in FIG. 3 as associated with the cells Cell13 and Cell14. A similar arrangement (not visible in the figures for simplicity) may apply to the other cells in the battery pack BP.

As discussed previously, $R_{LPF}$ and CAP define the pole (that is, the cut-off or corner frequency) of the low-pass charge-sensing filter, while the resistance value of the resistors $R_{DIS}$ defines the discharge cell current for balance purposes.

It will be appreciated that, while exemplified herein with reference to FIG. 13, where only the two cells Cell13 and Cell14 are visible, the arrangement discussed in the foregoing is reproduces for all of the odd-numbered and even-numbered charge pin pairs in the device 10.

Other than for the points discussed in the following such an arrangement may be regarded as conventional in the art, thus making it unnecessary to provide a more detailed description herein.

As noted, open load and leakage detection are desirable features of devices 10 as exemplified herein.

Open load detection involves detecting the existence of a correct electrical coupling (connection) of the Cn pins to the nodes of the associated cells C in the battery pack BP with an expected value of the resistor $R_{LPF}$ (used as a low-pass filter in combination with a capacitor CAP) present. Leakage current detection involves detecting if there is a leakage current on the capacitors CAP.

As discussed previously, certain solutions have been proposed involving two measurements acts with pull-up and the pull-down currents with a subsequent evaluation of the difference between the two. As noted, various drawbacks of those arrangements may be related to these measures being possibly performed at different times (with possible signal changes therebetween) and to possible electromagnetic interference due, for instance by noise generated by an electric motor and the related driver, for instance in a vehicle V as exemplified in FIG. 1.

One or more embodiments may take advantage of the presence of the charge distribution pins Sn and Bn_n−1 already provided for balance purposes, that is, in order to discharge cells that are over-charged in order to facilitate an equalized distribution of electrical charge over the various cells, which is found to improve battery pack performance.

One or more embodiments may facilitate performing two measurements (open load and leakage current) being performed substantially at the same time, that is, with no appreciable time delays. As a result, measurements will not be affected by errors related to possible signal changes while also facilitating accurate detection of external connections.

Figure 4:
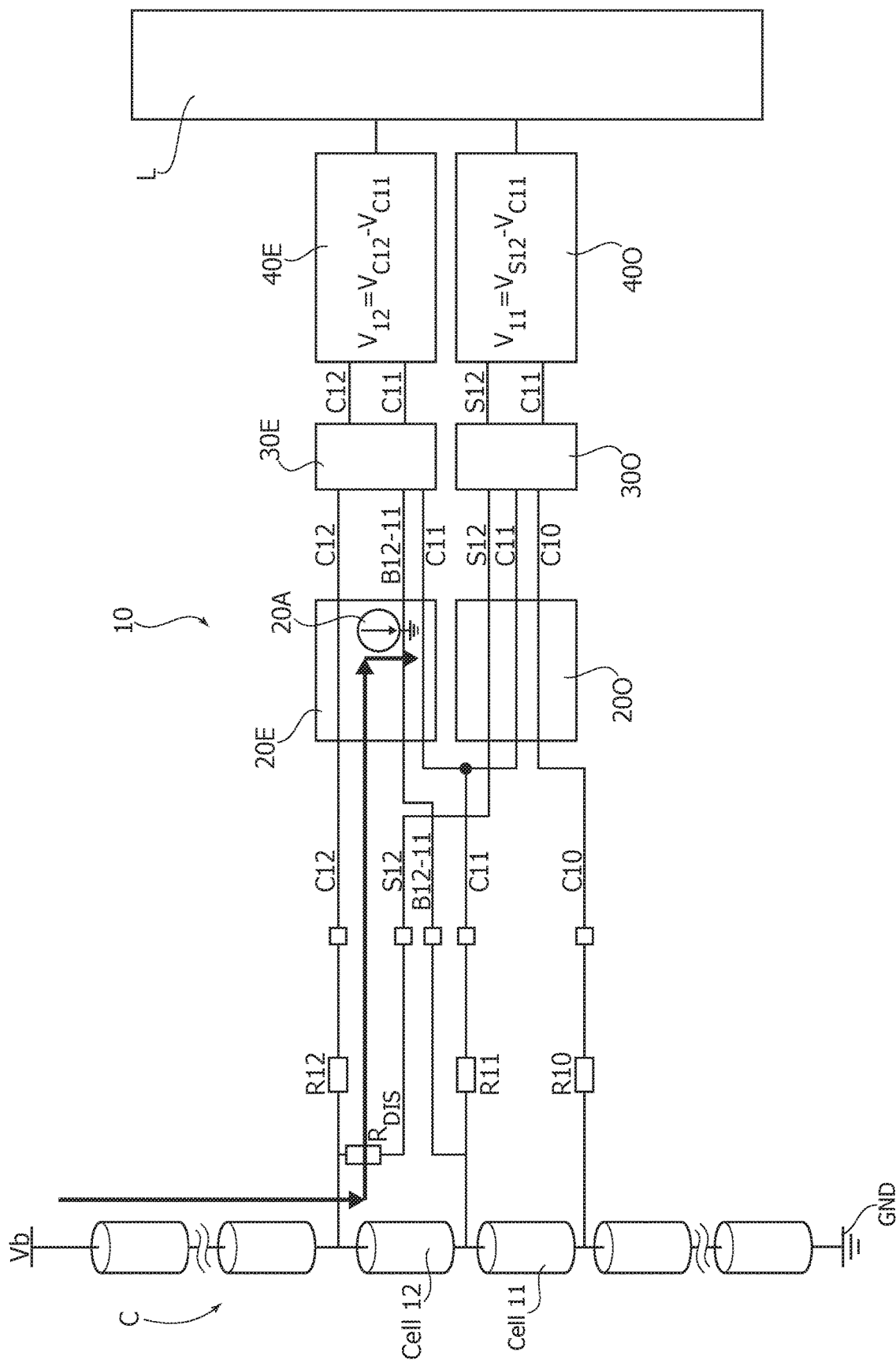
Figure 5:
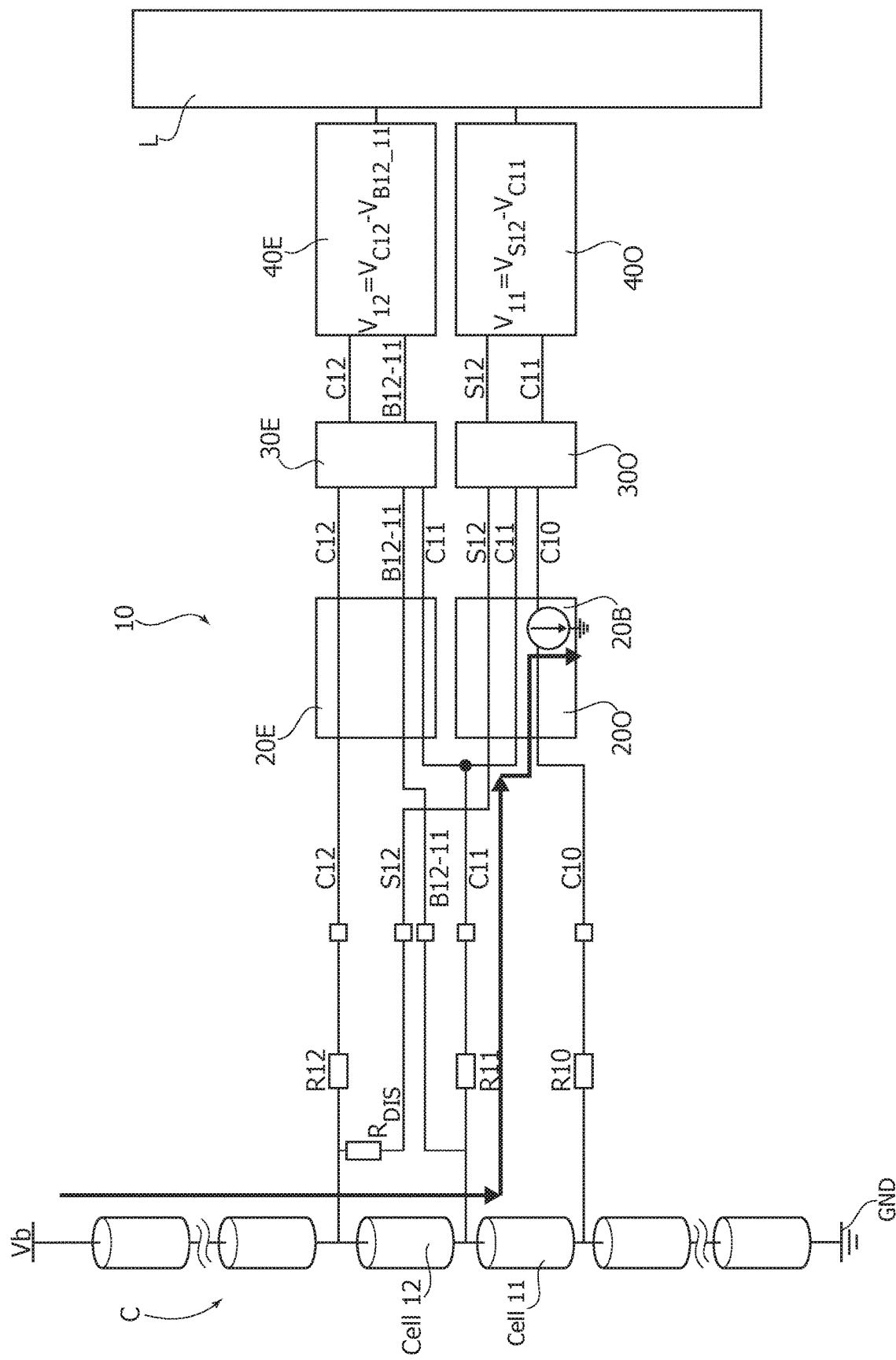
Figure 6:
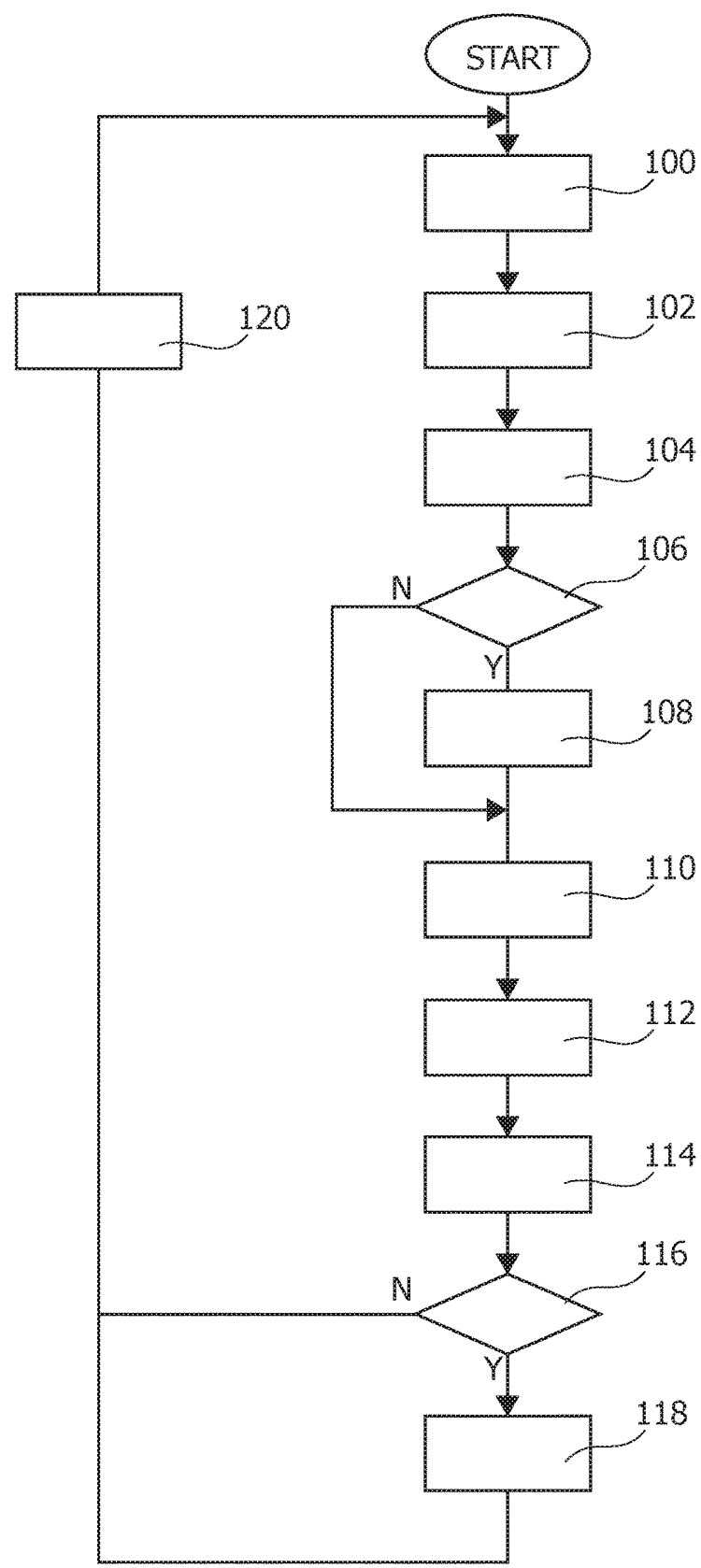
FIG. 6 is a flow chart exemplary of open load detection according to embodiments.

In one or more embodiments the related (diagnosis) procedure may comprise two acts, as exemplified in FIGS. 4 and 5 and the flow chart of FIG. 6, namely:

open load detection on even-numbered pins (C2, C4, . . . , C14)—FIG. 4, and open load detection on odd-numbered pins (that is C1, C3, . . . , C13)—FIG. 5.

For the sake of simplicity, FIGS. 4 and 5 (and the flow chart of FIG. 6) refer to only two cells of the plurality of cells C, namely Cell11 (coupled between the odd-numbered pair of pins C10 and C11), and Cell12 (coupled between the even-numbered pair of pins C11 and C12).

It will be otherwise understood that these two cells may be regarded as lying between a set of "lower" cells, namely Cell1 to Cell10 and a set of "upper" cells, namely Cell13 and Cell14.

As exemplified in FIGS. 4 and 5, the "odd-numbered" cells (Cell11 being exemplary of these) are shown coupled with a cascaded arrangement of a current "sinker" 20O (20—Odd), a multiplexer 30O (30—Odd) and an analog-to-digital converter (ADC) 40O (40—Odd).

Similarly the "even-numbered" cells (Cell12 being exemplary of these) are shown coupled with a cascaded arrangement of a current "sinker" 20E (20—Even), a multiplexer 30E (30—Even) and an analog-to-digital converter (ADC) 40E (40—Even).

It will be otherwise appreciated that—while illustrated as individual distinct elements for the sake of simplicity and ease of understanding—the various components 20O, 30O, 40O, and 20E, 30E, 40E may incorporated to single combined components. For instance, the current sinkers 20O, 20E may be integrated with the multiplexers 30O, 30E.

As exemplified herein, the current sinkers 20O, 20E can be activated (for instance under the control of the logic circuit L) and/or an external controller (not visible in the figures) to selectively draw currents from the lines coupling the cells C to respective pins in the device 10 as discussed in the following.

In one or more embodiments, the multiplexers 30O, 30E may comprise three inputs lines and two output lines.

In one or more embodiments the multiplexers 30O, 30E can be configured to apply to the inputs of the corresponding ADC's 40O, 40E the (voltage) signals sensed across the respective cell.

For instance, during normal operation, the multiplexer 20O may be configured to apply to the pins C10, C11, the voltage sensed across the Cell11 (via resistors R10, R11, exemplary of corresponding resistors $R_{LPF}$—again, the associated capacitors CAP are not visible for simplicity), while the multiplexer 20E may be configured to apply to the pins C11, C12 the voltage sensed across the Cell12 (via resistors R11, R12 exemplary of corresponding resistors $R_{LPF}$—once more, the associated capacitors CAP are not visible for simplicity).

Optionally, in one or more embodiments, the multiplexers 30O, 30E and the ADC converters 40O, 40E may be configured (together with differential level shifter stage, not visible in the figures) to implement a Built-In Self-Test (BIST) arrangement as disclosed in the co-pending Italian patent application already referred to in the foregoing and filed on even date in the name of the same applicant.

As exemplified in FIGS. 4 and 5, in one or more embodiments the current sinkers 20O (odd-numbered cells) and 20E (even-numbered cells) as well as the associated multiplexers 30O, 30E may be coupled in such a way that, in each pair of an odd-numbered cell (here Cell1) and an even-numbered cell (here Cell12), the "odd-numbered" current sinker/multiplexer 20O/30O is also coupled to the "S" pin of the even-numbered cell (here, pin S12) while the "even-numbered" current sinker/multiplexer 20E/30E is also coupled to the Bn_n–1 pin (here B12_11) coupled between the two cells in the pair (here Cell11 and Cell12).

The flowchart of FIG. 6 is exemplary of possible acts in an open-load detection process. In one or more embodiments, the various acts discussed in the following are performed in an automated way under the control of the logic circuit L.

Considering FIG. 4 first, in an act as exemplified by block 100 a current generator 20A (of any known type) is activated in the even-numbered current sinker 20E to draw a current of intensity I from the pin C12 (through the resistor R12) while the other pins are passed on directly through the current sinkers 20E, 20O to the multiplexers 30E, 30O.

As exemplified in FIG. 4, the multiplexers 30E, 30O are controlled by the logic circuit L in such a way that, in an act 102:

the (voltage) signals at pins C12 and C11, namely $V_{C12}$ and $V_{C11}$ are applied to the even-numbered ADC 40E;

the (voltage) signals at pins S12 and C11, namely $V_{S12}$ and $V_{C11}$, are applied to the odd-numbered ADC 40O.

Conversion, performed in manner known per se in an act 104 in the converters 40E, 40O (for instance sigma-delta ADC converters) will result in a first differential signal $V_{12}=V_{C12}-V_{C11}$ (that is the difference of the signals at C12 and C11) and a second differential signal $V_{11}=V_{S12}-V_{C11}$ (that is the difference of the signals at S12 and C11) applied to the logic circuit L (in any known manner).

In one or more embodiments, in view of the connections exemplified in FIG. 4 (and the location of the current generator 20A providing a current intensity I) the difference $V_{11}-V_{12}$—that is $(V_{S12}-V_{C11})-(V_{C12}-V_{C11})$—calculated in the logic circuit L may be expected to correspond to the product $I*R_{12}$, where $R_{12}$ is the charge-sensing resistance associated with pin C12.

In an act 106, the value $V_{11}-V_{12}$ calculated at the act 104 can be compared with a threshold Vth corresponding to a nominal expected value for the resistor $R_{12}$.

If the check in the act 106 yields a positive outcome (for instance, a calculated resistance value for R12 in excess of Vth/I, that is R12>Vth/I) the pin C12 may be considered as "open" with a corresponding flag set in an act o18, for instance to be communicated as an error state for instance to an external microcontroller via the communication interface CI.

If the check in the act 106 yields a negative outcome, the pin C12 may be considered as "OK" with the act 108 bypassed.

Considering then FIG. 5, in an act as exemplified by block 110 a current generator 20A (of any known type) is activated in the odd-numbered current sinker 20O to draw a current of intensity I from the pin C11 (through the resistor R11) while the other pins are passed on directly through the current sinkers 20E, 20O to the multiplexers 30E, 30O.

As exemplified in FIG. 5, the multiplexers 30E, 30O are controlled by the logic circuit L in such a way that, in an act 112:

the (voltage) signals at pins C12 and B12_11, namely $V_{C12}$ and $V_{B12\_11}$ are applied to the even-numbered ADC 40E;

the (voltage) signals at pins S12 and C11, namely $V_{S12}$ and $V_{C11}$, are applied to the odd-numbered ADC 40O.

Conversion, again performed in manner known per se in an act 114 in the converters 40E, 40O (for instance sigma-delta ADC converters) will result in a first differential signal $V_{12}=V_{C12}-V_{B1211}$ (that is the difference of the signals at C12 and B12_11) and a second differential signal $V_1=V_{S12}-V_{C11}$ (that is the difference of the signals at S12 and C11) applied to the logic circuit L (in any known manner).

In one or more embodiments, in view of the connections exemplified in FIG. 5 (and the location of the current generator 20B providing a current intensity I) the difference $V_{11}-V_{12}$—that is $(V_{S12}-V_{C11})-(V_{C12}-VB_{12\_11})$—calculated in the logic circuit L may be expected to correspond to the product $I*R_{11}$, where $R_{11}$ is the charge-sensing resistance associated with pin C11.

In an act 116, the value $V_{11}-V_{12}$ calculated at the act 114 can be compared with a threshold Vth corresponding to a nominal expected value for the resistor $R_{11}$. This can be reasonably assumed to be identical to the threshold Vth corresponding to the nominal expected value for the resistor $R_{12}$.

If the check in the act 116 yields a positive outcome (for instance, a calculated resistance value for R11 in excess of Vth/I, that is R11>Vth/I) the pin C11 may be considered as "open" with a corresponding flag set in an act 118, for instance to be communicated as an error state for instance to an external microcontroller via the communication interface CI.

If the check in the act 116 yields a negative outcome, the pin C11 may be considered as "OK" with the act 118 bypassed.

The block 120 in the flowchart of FIG. 6 is indicative of a time delay (set at a fixed value or at an optionally controllable value by the logic L) reached from the act 118 (or from the act 116 in case this yields a negative outcome) after which the open load detection procedure as discussed previously may be repeated.

By way of—purely exemplary reference—by assuming conventional values of 3V and 1 kOhm for the (nominal) voltage across any of the cells and for the resistors $R_{LPF}=R_{12}=R_{11}$, a judicious choice for the intensity of the current I may be 50 μA with a threshold Vth selected at 60 mV.

Different outcomes of the acts 106 and 116 (I=open, N=non-open) may thus correspond for values of the differences $V_{11}-V_{12}$ equal to 5V and 50 mV.

It will be appreciated that the acts exemplified in the flowchart of FIG. 6 can be performed in parallel, for instance by checking first all the even numbered cells Cell2, Cell4, ..., Cell14 and the odd-numbered cells Cell1, Cell3, ..., Cell13 respectively, or vice versa), this facilitating a complete check for open loads (cells C) over the whole device 10.

It will be appreciated that one or more embodiments this approach for open load diagnostic check over the whole device 10 may involve measurements performed substantially at the same time, thus reducing possible error effects due to signal variations while also facilitating accurate detection of external connections.

One or more embodiments exploit pins already available in the device 10 for other functions (for instance charge balance) so that no additional pins are required for that purpose.

Figure 7:
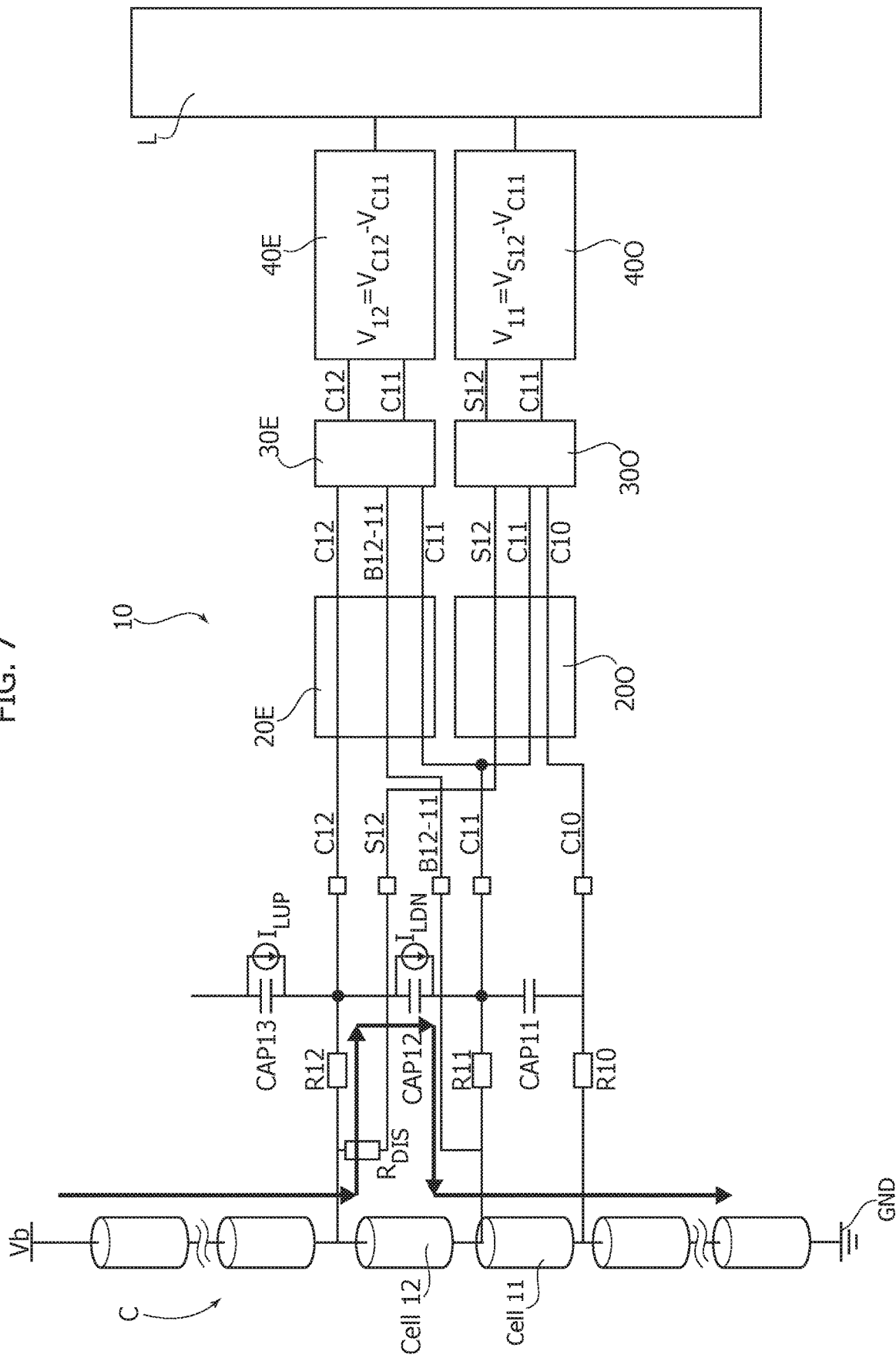
FIG. 7 is exemplary of leakage current evaluation according to embodiments.
Figure 8:
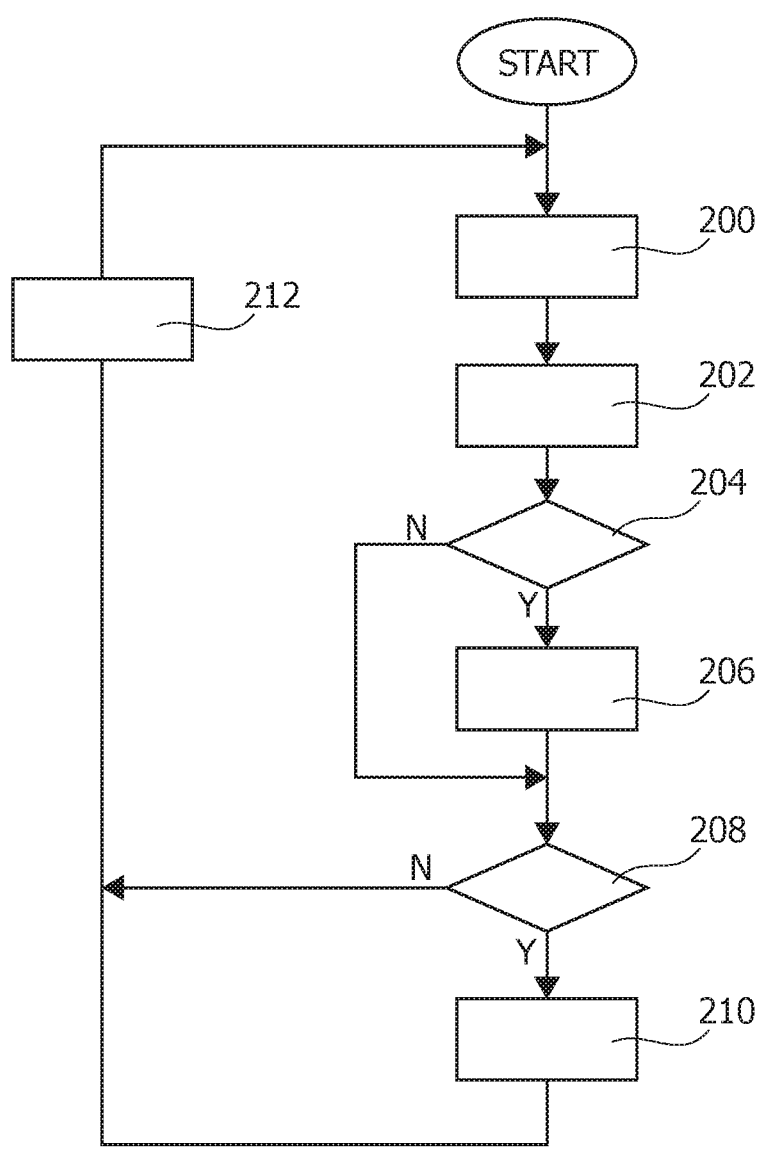
FIG. 8 is a flow chart exemplary of leakage current evaluation according to embodiments.

The diagram of FIG. 7 and the flowchart of FIG. 8 are exemplary of a procedure for leakage current detection (evaluation) in one or more embodiments.

Such a leakage current may be related to possible damage of the external capacitors CAP as exemplified in FIG. 2.

Specifically, FIG. 7 exemplifies to possible leakage evaluation in connection with the capacitors CAP12 and CAP13 arranged "upstream" of cells Cell11 and Cell12 being otherwise understood that the same approach may be notionally adopted for all the capacitors CAP associated with the device 10.

In a procedure as exemplified in FIGS. 7 and 8 no current generator is contemplated to be enabled and the pins involved are directly transferred through the multiplexers 30O, 30E via the current sinkers 20O, 20E (which can be regarded as non-existing for leakage evaluation).

As for the rest, the signals sensed/calculated in a leakage evaluation procedure as exemplified herein are essentially the same as those sensed/calculated in the "even" open load detection procedure exemplified in FIG. 4.

As exemplified in FIG. 7, the multiplexers 30E, 30O are controlled by the logic circuit L in such a way that, in an act 200:

the (voltage) signals at pins C12 and C11, namely $V_{C12}$ and $V_{C11}$ are applied to the even-numbered ADC 40E;

the (voltage) signals at pins S12 and C11, namely $V_{S12}$ and $V_{C11}$, are applied to the odd-numbered ADC 40O.

Conversion, performed in manner known per se in an act 202 in the converters 40E, 40O (for instance sigma-delta ADC converters) will result in a first differential signal $V_{12}=V_{C12}-V_{C11}$ (that is the difference of the signals at C12 and C11) and a second differential signal $V_{11}=V_{S12}-V_{C11}$ (that is the difference of the signals at S12 and C11) applied to the logic circuit L (in any known manner).

In one or more embodiments, in view of the connections exemplified in FIG. 7 the difference $V_{11}-V_{12}$—that is $(V_{S12}-V_{C11})-(V_{C12}-V_{C11})$ will become available in the logic circuit L.

One or more embodiments may rely on the otherwise (judicious) assumption that leakage failure on capacitors such as CAP12 and CAP13 is highly unlikely to occur simultaneously.

Consequently, assuming a leakage failure occurring at capacitor CAP13, the corresponding leakage current $I_{LUP}$ will be different from 0 while the current $I_{LDN}$ at CAP12 will be equal to 0.

Conversely in the case of leakage failure at CAP12, $I_{LUP}$ will be equal to 0 while $I_{LDN}$ will be different from 0.

In acts 204 and 208, the value of the difference $V_{11}-V_{12}$, may thus be checked by comparing it with:

in the act 204, with a negative (leak) threshold, namely $V_{11}-V_{12}=-I_{LUP}R_{12}<-Vth_{leak}$, that is $I_{LUP}>Vth_{leak}/R12$, with the threshold being exceeded (in the negative direction) being indicative of the presence of a leakage fault on C13 (CAP C13);

in the act 208, with a positive (leak) threshold, namely $V_{11}-V_{12}=I_{LDN}R_{12}>Vth_{leak}$ (this can be assume to be the same as the leakage threshold just considered due to the expected similarity of the various capacitors CAP coupled to the device 10), that is $I_{LDN}>Vth_{leak}/R12$, with the threshold being exceeded (in the positive direction) being indicative of the presence of a leakage fault on C12 (CAP C12).

If either of the comparisons in acts 204 and 208 yields an outcome indicative of capacitor leakage, a corresponding flag may be set in an act 206 or 210 and communicated, for instance via the communication interface CI to an outer controller.

If, conversely the comparisons in the acts 204 and 208 yield outcomes indicative of the absence capacitor leakage the corresponding acts 206 or 210 can be skipped.

As noted, the representation of FIG. 8 is primarily for the sake of explanation, insofar as leakage failure on capacitors such as CAP12 and CAP13 are highly unlikely to occur simultaneously.

Consequently, in one or more embodiments the sequence of acts 204 to 210 may simply implemented as a check on the modulus $|V_{11}-V_{12}|$ with a leakage condition declared if a threshold $Vth_{leak}$ is reached, the sign (negative or positive) of the difference indicative of the faulty capacitor out of CAP12 or CAP13.

Again, the block 212 in FIG. 8 is indicative of the possibility of the leakage detection (evaluation) procedure just discussed being repeated after a time delay which may be set automatically or correspond to an on-demand request.

As discussed previously for the open load test procedure, the leakage detection procedure may be repeated for all the cells to which the device 10 is coupled.

One or more embodiments thus facilitate evaluating with accuracy also leakage currents on capacitors, thus facilitating possible identification of damaged capacitors CAP (capacitors between adjacent Cn and Cn−1 pins).

In one or more embodiments the leakage current detection procedure can be alternated with the open load detection procedure discussed previously with current generators 20A and 20B disabled.

One or more embodiments may thus relate to a method of operating a control device in a battery management system (for instance, BMS), wherein the control device (for instance, 10) may comprise:

an ordered sequence of charge-sensing pins (for instance, C0 to C14) arranged in a plurality of pairs (for instance C0, C1; C1, C2; . . . ; C12, C13; C13, C14) of charge-sensing pins in an ordered sequence of odd- and even-numbered pairs of charge-sensing pins, the charge sensing pins in each pair of charge-sensing pins in the plurality of pairs of charge-sensing pins coupled via a coupling resistor (for instance, $R_{LPF}$) to a respective cell (for instance, Cell1, Cell2, . . . , Cell13, Cell4) in a battery pack to sense the voltage across the respective cell, wherein each odd-numbered (for instance, C0, C1; . . . ; C12, C13) resp. even-numbered (for instance, C1, C2; . . . ; C13, C14) pair of charge-sensing pins shares a common charge sensing pin with a subsequent even-numbered pair resp. a previous odd-numbered pair of charge-sensing pins in the ordered sequence of odd- and even-numbered pairs of charge-sensing pins, first (for instance, S1, . . . , S14) and second (for instance, B2-1, . . . , B14-13) charge distribution pins, wherein each odd-numbered pair of charge-sensing pins and the subsequent even-numbered pair of charge-sensing pins in the ordered sequence of odd- and even-numbered pairs of charge-sensing pins comprises:

a) an odd-numbered first charge distribution pin (for instance, S1, S3, . . . , S13) coupled via a discharge resistor (for instance, $R_{DIS}$) to the charge sensing pin of the odd-numbered pair of charge-sensing pins other than the common charge sensing pin, b) an even-numbered first charge distribution pin (for instance, S2, S4, . . . , S14) coupled (for instance $R_{DIS}$) to the charge sensing pin of the even-numbered pair of charge-sensing pins other than the common charge sensing pin, c) a second (for instance, B2-1, . . . , B14-13) charge distribution pin coupled (for instance, $R_{LPF}$) to the common charge sensing pin, the second charge distribution pin configured to be selectively coupled (for instance via switches such as SW13, SW14) to the odd-numbered first charge distribution pin and the even-numbered first charge distribution pin to exchange electrical charge therewith.

In one or more embodiments, the method may comprise, for each odd-numbered pair of charge-sensing pins and the subsequent even-numbered pair of charge-sensing pins in the ordered sequence of odd- and even-numbered pairs of charge-sensing pins:

an open load test (for instance, 100 to 108; 110 to 118) comprising:

a) activating (for instance, 100) a first current (for instance, 20A) through the charge sensing pin (for instance, C12) of the even-numbered pair of charge-sensing pins other than the common charge sensing pin (for instance, C11) and the respective coupling resistor (for instance, R12), sensing (for instance, 102, 40E, 40O), with the first current activated:

i) a first voltage drop (for instance, $V_{12}$) between the charge sensing pin of the subsequent even-numbered pair other than common charge sensing pin and the common charge sensing pin, ii) a second voltage drop (for instance, $V_{11}$) between an even-numbered first charge distribution pin and the common charge sensing pin, calculating (for instance, 104, L) a difference (for instance, $V_{11}-V_{12}$) between the first voltage drop and the second voltage drop sensed with the first current activated and comparing (for instance, 106) the difference calculated with a threshold and declaring (for instance, by taking adequate action under the circumstances, such as issuing a corresponding alert signal) an open circuit condition for the charge sensing pin through which the first current was activated as a result of the difference calculated reaching the given threshold;

b) activating (for instance, 110) a second current (for instance, 20B) through the common charge sensing pin and the respective coupling resistor, sensing (for instance, 112, 40E, 40O), with the second current activated:

i) a first voltage drop between the charge sensing pin of the subsequent even-numbered pair other than common charge sensing pin and the second charge distribution pin;

ii) a second voltage drop between the even-numbered first charge distribution pin and the common charge sensing pin, calculating (for instance, 114, L) a difference between the first voltage drop and the second voltage drop sensed with the second current activated; and comparing the difference calculated with a threshold and declaring an open circuit condition for the common charge sensing pin as a result of the respective difference calculated reaching the threshold, and/or a current leakage test (for instance, 200 to 210) comprising:

c)—sensing (for instance, 200, 40E, 40O):

i) a first voltage drop between the charge sensing pin of the subsequent even-numbered pair other than common charge sensing pin and the common charge sensing pin, ii) a second voltage drop between an even-numbered first charge distribution pin and the common charge sensing pin, calculating (for instance, 202, L) a difference between the first voltage drop and the second voltage drop and comparing (for instance, 204, 206) the modulus of the difference calculated with at least one leakage threshold and declaring a current leakage condition (for instance, by taking adequate action under the circumstances, such as issuing a corresponding alert signal) at an odd-numbered pair of charge-sensing pins (for instance, CAP13; C12, C13) following the subsequent even-numbered pair in the ordered sequence of odd- and even-numbered pairs of charge-sensing pins or at the even-numbered pair (for instance, CAP12; C11, C12) in the ordered sequence of odd- and even-numbered pairs of charge-sensing pins as a result of the leakage threshold being reached by the modulus of the difference calculated.

In one or more embodiments comprising the current leakage test, the current leakage test may comprise comparing the difference between the first voltage drop and the second voltage drop with negative (for instance, 204) and positive (for instance, 208) leakage thresholds and declaring a current leakage condition:

at the odd-numbered pair of charge-sensing pins following the subsequent even-numbered pair in the ordered sequence of odd- and even-numbered pairs of charge-sensing pins, or at the even-numbered pair in the ordered sequence of odd- and even-numbered pairs of charge-sensing pins as a result of the leakage threshold, as a result of the difference calculated reaching either one of the negative and the positive (208) leakage thresholds.

One or more embodiments may comprise performing the open load test and/or the current leakage test simultaneously in a plurality of odd-numbered pairs of charge-sensing pins and in a plurality of even-numbered pairs of charge-sensing pins in the ordered sequence of odd- and even-numbered pairs of charge-sensing pins.

One or more embodiments may comprise performing the open load test, the open load test comprising activating the first current and the second current alternatively to each other.

One or more embodiments may comprise performing the current leakage test in the absence of currents activated through the charge sensing pins and the respective coupling resistor.

One or more embodiments may comprise performing the open load test and/or the current leakage test repeatedly with intermission intervals between subsequent repetitions.

In one or more embodiments a control device for a battery management system may comprise:

an ordered sequence of charge-sensing pins (for instance, C0 to C14) arranged in a plurality of pairs (for instance C0, C1; C1, C2; . . . ; C12, C13; C13, C14) of charge-sensing pins in an ordered sequence of odd- and even-numbered pairs of charge-sensing pins, the charge sensing pins in each pair of charge-sensing pins in the plurality of pairs of charge-sensing pins coupled via a coupling resistor (for instance, $R_{LPF}$) to a respective cell (for instance, Cell1, Cell2, . . . , Cell13, Cell14) in a battery pack to sense the voltage across the respective cell, wherein each odd-numbered (for instance, C0, C1; . . . ; C12, C13) resp. even-numbered (for instance, C1, C2; . . . ; C13, C14) pair of charge-sensing pins shares a common charge sensing pin with a subsequent even-numbered pair resp. a previous odd-numbered pair of charge-sensing pins in the ordered sequence of odd- and even-numbered pairs of charge-sensing pins, first (for instance, S1, . . . , S14) and second (for instance, B2-1, . . . , B14-13) charge distribution pins, wherein each odd-numbered pair of charge-sensing pins and the subsequent even-numbered pair of charge-sensing pins in the ordered sequence of odd- and even-numbered pairs of charge-sensing pins comprises:

a) an odd-numbered first charge distribution pin (for instance, S1, S3, . . . , S13) coupled via a discharge resistor (for instance, $R_{DIS}$) to the charge sensing pin of the odd-numbered pair of charge-sensing pins other than the common charge sensing pin, b) an even-numbered first charge distribution pin (for instance, S2, S4, . . . , S14) coupled (for instance $R_{DIS}$) to the charge sensing pin of the even-numbered pair of charge-sensing pins other than the common charge sensing pin, c) a second (for instance, B2-1, . . . , B14-13) charge distribution pin coupled (for instance, $R_{LPF}$) to the common charge sensing pin, the second charge distribution pin configured to be selectively coupled (for instance via switches such as SW13, SW14) to the odd-numbered first charge distribution pin and the even-numbered first charge distribution pin to exchange electrical charge therewith, wherein the device may be configured to be operated with the method of one or more embodiments and comprise:

sensing circuits (for instance, 40E, 40O) configured to sense the first and second voltage drops (for instance, $V_{11}$; $V_{12}$), calculation circuits (for instance, L) configured to calculate the differences (for instance, $V_{11}-V_{12}$) between the first and second voltage drops, compare the difference calculated with thresholds and declare the open circuit conditions and/or the current leakage conditions and with the device configured to perform the open load test, current generators activatable to provide the first current and the second current.

In one or more embodiments, an electrically powered vehicle (for instance, V), may comprise:

a battery pack (for instance, BP) comprising a plurality of electrical battery cells (for instance, C), a battery management system (for instance, BMS) coupled to the battery pack, a control device according to one or more embodiments configured to control the battery management system.

Without prejudice to the underlying principles, the details and embodiments may vary, even significantly, with respect to what has been described by way of example only without departing from the extent of protection.

The extent of protection is determined by the annexed claims.

What is claimed is:

1. A method for performing a test using a device, wherein the device comprises:
    a plurality of charge-sensing pins;
    a plurality of coupling resistors, each coupling resistor coupled between a respective charge-sensing pin and a terminal to be coupled to a battery pack so that each consecutive pair of charge-sensing pins can sense a voltage across a respective cell of the battery pack, the consecutive pairs comprising alternating odd-numbered pairs and even-numbered pairs arranged in an ordered sequence;
    a first plurality of charge distribution pins;
    a plurality of discharge resistors, each discharge resistor coupled between a first charge-sensing pin of each pair of charge-sensing pins and a charge distribution pin of the first plurality of charge distribution pins, wherein each cell of the battery pack is to be coupled to only a respective discharge resistor of the plurality of discharge resistors;
    a second plurality of charge distribution pins, wherein each charge distribution pin of the second plurality of charge distribution pins is coupled to a second charge-sensing pin of each pair of charge-sensing pins through a respective coupling resistor; and
    a plurality of sensing circuits coupled to the plurality of charge-sensing pins and configured to sense voltage drops of the battery pack; and the test comprises:
    sensing a first voltage drop between the respective charge-sensing pin of the subsequent even-numbered pair other than a common charge sensing pin and the common charge sensing pin;
    sensing a second voltage drop between an even-numbered first charge distribution pin and the common charge sensing pin;
    calculating a difference between the first voltage drop and the second voltage drop; and
    performing a comparison between the calculated difference and a threshold.

2. The method of claim 1, wherein the performing the test comprises performing an open load test, wherein the performing the open load test comprises:
- activating a first current through the respective charge-sensing pin of the even-numbered pairs of charge-sensing pins other than the common charge sensing pin and the each coupling resistor;
- sensing the first voltage drop with the first current activated;
- sensing the second voltage drop with the first current activated;
- performing the comparison by comparing the calculated difference with the threshold; and
- determining an open circuit condition for the respective charge-sensing pin through which the first current was activated as a result of the calculated difference reaching the threshold.

3. The method of claim 2, wherein the performing the open load test further comprises:
- activating a second current through the common charge sensing pin and the respective coupling resistor;
- sensing, with the second current activated, a first voltage drop between the charge sensing pin of the subsequent even-numbered pair other than common charge sensing pin and the second charge distribution pin;
- sensing, with the second current activated, a second voltage drop between the even-numbered first charge distribution pin and the common charge sensing pin;
- calculating a difference between the first voltage drop and the second voltage drop sensed with the second current activated;
- comparing the calculated difference with a threshold; and
- determining an open circuit condition for the common charge sensing pin as a result of a respective difference calculated reaching the threshold.

4. The method of claim 3, wherein the performing the open load test comprises activating the first current and the second current alternatively to each other.

5. The method of claim 1, wherein the performing the test comprises the performing a current leakage test, wherein performing the current leakage test comprises:
- sensing the first voltage drop;
- sensing the second voltage drop;
- performing the comparison by comparing the modulus of the calculated difference between the first voltage drop and the second voltage drop with a leakage threshold; and
- determining a current leakage condition at an odd-numbered pair of charge-sensing pins following the subsequent even-numbered pair in the ordered sequence of odd- and even-numbered pairs of charge-sensing pins or at the even-numbered pair in the ordered sequence of odd- and even-numbered pairs of charge-sensing pins as a result of the leakage threshold being reached by the modulus of the calculated difference.

6. The method of claim 5, wherein the current leakage test comprises comparing the difference between the first voltage drop and the second voltage drop with a negative leakage threshold and a positive leakage threshold and declaring a current leakage condition at the odd-numbered pair of charge-sensing pins following the subsequent even-numbered pair in the ordered sequence of odd- and even-numbered pairs of charge-sensing pins as a result of the calculated difference reaching either one of the negative leakage threshold and the positive leakage threshold.

7. The method of claim 5, wherein the current leakage test comprises comparing the difference between the first voltage drop and the second voltage drop with a negative leakage threshold and a positive leakage threshold and declaring a current leakage condition at the even-numbered pair in the ordered sequence of odd- and even-numbered pairs of charge-sensing pins as a result of the difference calculated reaching either one of the negative leakage threshold and the positive leakage threshold.

8. The method of claim 5, wherein the performing the current leakage test comprises performing the current leakage test in absence of currents activated through the charge sensing pins and the respective coupling resistor.

9. The method of claim 1, wherein the performing the test comprises performing an open load test and a current leakage test simultaneously.

10. The method of claim 1, wherein the performing the test comprises performing the test repeatedly with intermission intervals between subsequent repetitions.

11. A method of operating a control device in a battery management system, wherein the control device comprises:
- an ordered sequence of charge-sensing pins arranged in a plurality of pairs of charge-sensing pins in an ordered sequence of odd- and even-numbered pairs of charge-sensing pins, the charge sensing pins in each pair of charge-sensing pins in the plurality of pairs of charge-sensing pins coupled via a coupling resistor to a respective cell in a battery pack to sense a voltage across the respective cell, wherein each odd-numbered pair of charge-sensing pins and respective even-numbered pair of charge-sensing pins shares a common charge sensing pin with a subsequent even-numbered pair of charge-sensing pins and respective previous odd-numbered pair of charge-sensing pins in the ordered sequence of odd- and even-numbered pairs of charge-sensing pins;
- a first plurality of charge distribution pins;
- a second plurality of charge distribution pins;

wherein each odd-numbered pair of charge-sensing pins and the subsequent even-numbered pair of charge-sensing pins in the ordered sequence of odd- and even-numbered pairs of charge-sensing pins comprises:
- an odd-numbered first charge distribution pin coupled via a discharge resistor to the charge sensing pin of the odd-numbered pair of charge-sensing pins other than the common charge sensing pin;
- an even-numbered first charge distribution pin coupled to the charge sensing pin of the even-numbered pair of charge-sensing pins other than the common charge sensing pin; and
- a second charge distribution pin coupled to the common charge sensing pin, the second charge distribution pin configured to be selectively coupled to the odd-numbered first charge distribution pin and the even-numbered first charge distribution pin to exchange electrical charge therewith;

wherein the method comprises performing a test for each odd-numbered pair of charge-sensing pins and the subsequent even-numbered pair of charge-sensing pins in the ordered sequence of odd- and even-numbered pairs of charge-sensing pins, the test comprising:
- sensing a first voltage drop between the charge sensing pin of the subsequent even-numbered pair other than common charge sensing pin and the common charge sensing pin;
- sensing a second voltage drop between an even-numbered first charge distribution pin and the common charge sensing pin;
- calculating a difference between the first voltage drop and the second voltage drop;

performing a comparison with the calculated difference and a threshold; and determining a fault condition based on a result of the comparison.

12. The method of claim 11, wherein the performing the test comprises the performing an open load test, wherein performing the open load test comprises:

activating a first current through the charge sensing pin of the even-numbered pair of charge-sensing pins other than the common charge sensing pin and the respective coupling resistor;

sensing the first voltage drop with the first current activated;

sensing the second voltage drop with the first current activated;

performing the comparison by comparing the calculated difference with the threshold;

determining an open circuit condition for the charge sensing pin through which the first current was activated as a result of the calculated difference reaching the threshold;

activating a second current through the common charge sensing pin and the respective coupling resistor;

sensing, with the second current activated, a first voltage drop between the charge sensing pin of the subsequent even-numbered pair other than common charge sensing pin and the second charge distribution pin;

sensing, with the second current activated, a second voltage drop between the even-numbered first charge distribution pin and the common charge sensing pin;

calculating a difference between the first voltage drop and the second voltage drop sensed with the second current activated;

comparing the calculated difference with a threshold; and determining an open circuit condition for the common charge sensing pin as a result of the calculated difference reaching the threshold.

13. The method of claim 12, wherein the performing the open load test comprises activating the first current and the second current alternatively to each other.

14. The method of claim 11, wherein the performing the test comprises the performing a current leakage test, wherein performing the current leakage test comprises:

sensing the first voltage drop;

sensing the second voltage drop;

performing the comparison by comparing modulus of the calculated difference between the first voltage drop and the second voltage drop with a leakage threshold; and determining a current leakage condition at an odd-numbered pair of charge-sensing pins following the subsequent even-numbered pair in the ordered sequence of odd- and even-numbered pairs of charge-sensing pins or at the even-numbered pair in the ordered sequence of odd- and even-numbered pairs of charge-sensing pins as a result of the leakage threshold being reached by the modulus of the difference calculated.

15. The method of claim 14, wherein the current leakage test comprises comparing the difference between the first voltage drop and the second voltage drop with a negative leakage threshold and a positive leakage threshold and declaring a current leakage condition at the odd-numbered pair of charge-sensing pins following the subsequent even-numbered pair in the ordered sequence of odd- and even-numbered pairs of charge-sensing pins as a result of the calculated difference reaching either one of the negative leakage threshold and the positive leakage threshold.

16. The method of claim 14, wherein the current leakage test comprises comparing the difference between the first voltage drop and the second voltage drop with a negative leakage threshold and a positive leakage threshold and declaring a current leakage condition at the even-numbered pair in the ordered sequence of odd- and even-numbered pairs of charge-sensing pins as a result of the calculated difference reaching either one of the negative and the negative leakage threshold and the positive leakage threshold.

17. The method of claim 14, wherein the performing the current leakage test comprises performing the current leakage test in absence of currents activated through the charge sensing pins and the respective coupling resistor.

18. The method of claim 11, wherein the performing the test comprises performing an open load test and a current leakage test simultaneously in a plurality of odd-numbered pairs of charge-sensing pins and in a plurality of even-numbered pairs of charge-sensing pins in the ordered sequence of odd- and even-numbered pairs of charge-sensing pins.

19. A method of operating a control device in a battery management system, wherein the control device comprises:

an ordered sequence of charge-sensing pins arranged in a plurality of pairs of charge-sensing pins in an ordered sequence of odd- and even-numbered pairs of charge-sensing pins, the charge sensing pins in each pair of charge-sensing pins in the plurality of pairs of charge-sensing pins coupled via a coupling resistor to a respective cell in a battery pack to sense a voltage across the respective cell, wherein each odd-numbered and respective even-numbered pair of charge-sensing pins shares a common charge sensing pin with a subsequent even-numbered pair a respective previous odd-numbered pair of charge-sensing pins in the ordered sequence of odd- and even-numbered pairs of charge-sensing pins, first charge distribution pins and second charge distribution pins, wherein each odd-numbered pair of charge-sensing pins and the subsequent even-numbered pair of charge-sensing pins in the ordered sequence of odd- and even-numbered pairs of charge-sensing pins comprises:

an odd-numbered first charge distribution pin coupled via a discharge resistor to the charge sensing pin of the odd-numbered pair of charge-sensing pins other than the common charge sensing pin, an even-numbered first charge distribution pin coupled to the charge sensing pin of the even-numbered pair of charge-sensing pins other than the common charge sensing pin, a second charge distribution pin coupled to the common charge sensing pin, the second charge distribution pin configured to be selectively coupled to the odd-numbered first charge distribution pin and the even-numbered first charge distribution pin to exchange electrical charge therewith, wherein the method comprises, for each odd-numbered pair of charge-sensing pins and the subsequent even-numbered pair of charge-sensing pins in the ordered sequence of odd- and even-numbered pairs of charge-sensing pins:

an open load test comprising:

activating a first current through the charge sensing pin of the even-numbered pair of charge-sensing pins other than the common charge sensing pin and the respective coupling resistor, sensing, with the first current activated:
  a first voltage drop between the charge sensing pin of the subsequent even-numbered pair other than common charge sensing pin and the common charge sensing pin,
  a second voltage drop between an even-numbered first charge distribution pin and the common charge sensing pin,
calculating a difference between the first voltage drop and the second voltage drop sensed with the first current activated and comparing the calculated difference with a threshold and declaring an open circuit condition for the charge sensing pin through which the first current was activated as a result of the calculated difference reaching the threshold;
activating a second current through the common charge sensing pin and the respective coupling resistor,
sensing, with the second current activated:
  a first voltage drop between the charge sensing pin of the subsequent even-numbered pair other than common charge sensing pin and the second charge distribution pin;
  a second voltage drop between the even-numbered first charge distribution pin and the common charge sensing pin,
calculating a difference between the first voltage drop and the second voltage drop sensed with the second current activated; and
comparing the calculated difference with a threshold and declaring an open circuit condition for the common charge sensing pin as a result of the calculated difference reaching the threshold,
or
a current leakage test comprising:
  sensing:
    a first voltage drop between the charge sensing pin of the subsequent even-numbered pair other than common charge sensing pin and the common charge sensing pin,
    a second voltage drop between an even-numbered first charge distribution pin and the common charge sensing pin, and
  calculating a difference between the first voltage drop and the second voltage drop and comparing the modulus of the calculated difference with at least one leakage threshold and declaring a current leakage condition at an odd-numbered pair of charge-sensing pins following the subsequent even-numbered pair in the ordered sequence of odd- and even-numbered pairs of charge-sensing pins or at the even-numbered pair in the ordered sequence of odd- and even-numbered pairs of charge-sensing pins as a result of the leakage threshold being reached by the modulus of the calculated difference.

20. A control device for a battery management system, the control device comprising:
  an ordered sequence of charge-sensing pins arranged in a plurality of pairs of charge-sensing pins in an ordered sequence of odd- and even-numbered pairs of charge-sensing pins, the charge sensing pins in each pair of charge-sensing pins in the plurality of pairs of charge-sensing pins configured to be coupled via a coupling resistor to a respective cell in a battery pack to sense a voltage across the respective cell, wherein each odd-numbered and respective even-numbered pair of charge-sensing pins shares a common charge sensing pin with the subsequent even-numbered pair and respective previous odd-numbered pair of charge-sensing pins in the ordered sequence of odd- and even-numbered pairs of charge-sensing pins;
  a first plurality of charge distribution pins and a second plurality of charge distribution pins, wherein each odd-numbered pair of charge-sensing pins and the subsequent even-numbered pair of charge-sensing pins in the ordered sequence of odd- and even-numbered pairs of charge-sensing pins comprises an odd-numbered first charge distribution pin configured to be coupled via a discharge resistor to the charge sensing pin of the odd-numbered pair of charge-sensing pins other than the common charge sensing pin, an even-numbered first charge distribution pin configured to be coupled to the charge sensing pin of the even-numbered pair of charge-sensing pins other than the common charge sensing pin, and a second charge distribution pin configured to be coupled to the common charge sensing pin, the second charge distribution pin configured to be selectively coupled to the odd-numbered first charge distribution pin and the even-numbered first charge distribution pin to exchange electrical charge therewith,
  a processor circuit; and
  signal routing circuitry between the charge sensing pins, the first and second charge distribution pins and the processor circuit;
  wherein the control device is configured to perform a test by:
    sensing a first voltage drop between the charge sensing pin of the subsequent even-numbered pair other than common charge sensing pin and the common charge sensing pin;
    sensing a second voltage drop between an even-numbered first charge distribution pin and the common charge sensing pin;
    calculating a difference between the first voltage drop and the second voltage drop;
    performing a comparison with the calculated difference and a threshold; and
    determining a fault condition based on a result of the comparison.

21. The control device of claim 20, further comprising:
a plurality of sensing circuits configured to sense the first voltage drop and the second voltage drop; and
a plurality of calculation circuits configured to calculate the difference between the first voltage drop and the second voltage drop, to perform the comparison and to determine the fault condition.

22. The control device of claim 20, further comprising current generators activatable to provide a first current and a second current to the charge sensing pins.

23. An electrically powered vehicle, comprising:
a battery pack comprising a plurality of electrical battery cells;
a battery management system coupled to the battery pack; and
the control device according to claim 20 configured to control the battery management system.

* * * * *